(12) United States Patent
Nguyen et al.

(10) Patent No.: US 10,734,166 B2
(45) Date of Patent: Aug. 4, 2020

(54) STRUCTURE FOR ELECTRIC ENERGY STORAGE USING CARBON NANOTUBES

(71) Applicant: ZAPGOCHARGER LTD., Oxfordshire (GB)

(72) Inventors: Cattien Nguyen, San Jose, CA (US); You Li, Sunnyvale, CA (US); Hoang Nguyen Ly, San Jose, CA (US); Darrell Niemann, Santa Clara, CA (US); Bevan Vo, Santa Clara, CA (US); Phillip Kraus, San Jose, CA (US)

(73) Assignee: ZapGo Ltd, Oxfordshire (GB)

( * ) Notice: Subject to any disclaimer, the term of this patent is extended or adjusted under 35 U.S.C. 154(b) by 807 days.

(21) Appl. No.: 14/208,989

(22) Filed: Mar. 13, 2014

(65) Prior Publication Data
US 2018/0218847 A1 Aug. 2, 2018
US 2019/0304710 A9 Oct. 3, 2019

Related U.S. Application Data

(60) Provisional application No. 61/798,953, filed on Mar. 15, 2013.

(51) Int. Cl.
*B32B 9/00* (2006.01)
*H01G 11/36* (2013.01)
(Continued)

(52) U.S. Cl.
CPC ............ *H01G 11/36* (2013.01); *C01B 32/16* (2017.08); *C23C 8/10* (2013.01); *C23C 8/42* (2013.01); *C23C 8/80* (2013.01); *C23C 16/26* (2013.01); *C23C 16/50* (2013.01); *H01G 11/28* (2013.01); *H01G 11/46* (2013.01); *H01G 11/68* (2013.01); *H01G 11/86* (2013.01); *H01M 4/0404* (2013.01); *H01M 4/0428* (2013.01); *H01M 4/133* (2013.01); *H01M 4/1393* (2013.01); *H01M 4/366* (2013.01); *H01M 4/587* (2013.01); *H01M 4/625* (2013.01); *H01M 4/661* (2013.01); *H01M 4/667* (2013.01); *H01M 10/0525* (2013.01); *B82Y 30/00* (2013.01);
(Continued)

(58) Field of Classification Search
CPC ........ C01B 31/04; Y10T 428/30; B82Y 30/00
USPC ....................................... 428/408
See application file for complete search history.

(56) References Cited

U.S. PATENT DOCUMENTS 6,454,816 B1  9/2002  Lee
7,811,149 B2  10/2010  Liu et al.
(Continued)

FOREIGN PATENT DOCUMENTS

JP  2005129566 A  5/2005

OTHER PUBLICATIONS

Hostermann, Raman Spectroscopic Study of Solid Solution Spinel Oxides, UNLV University Libraries. Aug. 2011.

*Primary Examiner* — Daniel H Miller
(74) *Attorney, Agent, or Firm* — Hodgson Russ LLP

(57) ABSTRACT

A composite structure for an electric energy storage device is envisioned. The structure is made of a metal substrate and a metal oxide layer disposed over a majority of the metal substrate with the metal oxide layer being comprised of a first and second metals. Carbon nanotubes are disposed on the metal oxide layer. In an embodiment the first metal and the second metal are each selected from a group consisting of: iron, nickel, aluminum, cobalt, copper, chromium, and gold.

13 Claims, 7 Drawing Sheets

(51) Int. Cl.

| | |
|---|---|
| *C23C 8/10* | (2006.01) |
| *C23C 8/42* | (2006.01) |
| *C23C 16/26* | (2006.01) |
| *C23C 16/50* | (2006.01) |
| *H01G 11/28* | (2013.01) |
| *H01G 11/46* | (2013.01) |
| *H01G 11/86* | (2013.01) |
| *H01M 4/04* | (2006.01) |
| *H01M 4/36* | (2006.01) |
| *H01M 4/587* | (2010.01) |
| *H01M 10/0525* | (2010.01) |
| *H01M 4/66* | (2006.01) |
| *H01G 11/68* | (2013.01) |
| *H01M 4/133* | (2010.01) |
| *H01M 4/62* | (2006.01) |
| *H01M 4/1393* | (2010.01) |
| *C23C 8/80* | (2006.01) |
| *C01B 32/16* | (2017.01) |
| *H01M 4/96* | (2006.01) |
| *H01M 4/02* | (2006.01) |
| *B82Y 30/00* | (2011.01) |

(52) U.S. Cl.
CPC ........ *H01M 4/96* (2013.01); *H01M 2004/021* (2013.01); *Y10T 428/30* (2015.01)

(56) References Cited

U.S. PATENT DOCUMENTS

| | | |
|---|---|---|
| 8,226,808 B2 | 7/2012 | Kim |
| 8,333,810 B1 | 12/2012 | Meyyappan |
| 2005/0212014 A1* | 9/2005 | Horibe .................. B82Y 10/00 257/213 |
| 2005/0238810 A1 | 10/2005 | Scaringe |
| 2007/0258192 A1 | 11/2007 | Schindall et al. |
| 2008/0044651 A1 | 2/2008 | Douglas |
| 2008/0192407 A1 | 8/2008 | Lu et al. |
| 2009/0176164 A1 | 7/2009 | Matsui et al. |
| 2010/0028634 A1 | 2/2010 | Turevskaya et al. |
| 2010/0178564 A1 | 7/2010 | Asari et al. |
| 2010/0178568 A1 | 7/2010 | Unalan et al. |
| 2010/0233496 A1 | 9/2010 | Kim et al. |
| 2011/0157770 A1 | 6/2011 | Nguyen et al. |
| 2012/0040523 A1* | 2/2012 | Kondo .................. B82Y 30/00 438/610 |
| 2012/0058296 A1 | 3/2012 | Shah et al. |
| 2012/0132864 A1 | 5/2012 | Kar et al. |
| 2012/0320497 A1 | 12/2012 | Ehrenberg |
| 2014/0104752 A1 | 4/2014 | Bendale et al. |

* cited by examiner

STRUCTURE FOR ELECTRIC ENERGY STORAGE USING CARBON NANOTUBES

This application claims the priority of U.S. Provisional Application No. 61/798,953, filed Mar. 15, 2013, entitled "Carbon Nanotube Composite Structures", which is incorporated by reference in its entirety.

FIELD

This disclosure is directed to electrochemical energy storage systems (e.g., Liion secondary batteries), fuel cells, secondary batteries based on hydrogen storage and ultracapacitors that operate with carbon nanotube structures.

BACKGROUND

Energy storage devices, such as ultracapacitors (i.e., electrochemical capacitors, electrical double layer capacitors or supercapacitors) are increasingly important in powering a wide variety of devices such as, for example, motor vehicles, cellular telephones, computers, etc. and furthermore, may be used as a replacement for or in conjunction with conventional batteries. Ultracapacitors have a number of advantages compared to conventional batteries such as, for example, long life cycle, easy construction, short charging time, safety and high power density.

Conventional ultracapacitors include metal substrates (e.g., aluminum) on which are deposited active materials which have high surface area as the electrodes. Activated carbon is the most commonly used active material, which is typically deposited on metal substrates as a paste and forms a thin film on the surface of the substrate.

Recently, carbon nanotubes have been used as active materials in electrodes to form ultracapacitors. Similarly to activated carbon, carbon nanotubes can be deposited as a paste, which includes a binder, on metal substrates. However, deposition of carbon nanotubes as a paste leads to increased high interface resistance because of the continuing presence of the binder and poor mechanical/electrical contact between carbon nanotubes and metal collectors, which leads to poor power performance of the capacitor. Alternatively, carbon nanotubes may be grown on metal substrates with co-deposition of a metal catalyst. However, the continuing presence of the catalyst leads to poor power performance of the capacitor.

More recently, chemical vapor deposition has been used to directly grow continuous films of both vertically aligned or randomly dispersed carbon nanotubes on thick, highly polished metal substrates. Such carbon nanotubes are useful electrodes for constructing an ultracapacitor but are costly, difficult to package and/or mold and have a reduced performance profile because substantial resistance develops between the carbon nanotubes and the metal surface upon deposition of charge.

SUMMARY

In an embodiment, a composite structure that makes the electric energy storage device is envisioned. The structure is made of a metal substrate having a thickness of less than 500 μm. The metal substrate is further made of a metal oxide layer disposed over at least a majority of a first surface of the metal substrate with the average thickness of the metal oxide layer being less than 150 nm, and the metal oxide layer being comprised of at least a first metal and a second metal, the first metal and the second metal being different elements. The structure also has a plurality of carbon nanotubes disposed on a first surface of the metal oxide layer. In an embodiment, the first metal and the second metal are each selected from a group consisting of: iron, nickel, aluminum, cobalt, copper, chromium, and gold.

In an embodiment the first surface of the metal substrate has root mean square roughness of 100 nm or less. In an embodiment at least a first carbon nanotube is electrically coupled to the substrate. In an embodiment an electrical junction between the first carbon nanotube and the substrate is ohmic. In an embodiment an electric junction between the first carbon nanotube and the substrate is non-ohmic. In an embodiment the metal oxide layer has a resistivity of less than $1 \times 10^{14}$ 0-m. In an embodiment the metal oxide layer has a first metal oxide comprising the first metal and a second metal oxide comprising the second metal, where the first metal is selected from a first group of metals consisting of: iron, nickel, aluminum, cobalt, copper, chromium, and gold. In an embodiment second metal is selected from the first group of metals. In an embodiment the ratio of the first metal to the second metal in the oxide layer is at least 6:5. In an embodiment the carbon nanotubes are disposed on the metal oxide wherein at least 50% of the carbon nanotubes are orthogonal to the first surface of the metal oxide. In an embodiment the carbon nanotubes are disposed on the metal oxide wherein at least 50% of the carbon nanotubes are non-orthogonal to the first surface of the metal oxide. In an embodiment the ratio of carbon in the carbon nanotubes to the total amount of carbon in the total structure from process steps in the formation of the structure is at least 9:10.

A method of synthesizing a composite structure is envisioned. In an embodiment of the method, the steps include: providing a metal substrate, the substrate having a thickness of less than 500 μm; providing a metal oxide layer disposed over at least a majority of a first surface of the metal substrate, the metal oxide layer being comprised of at least a first metal and a second metal, the first metal being different from the second metal; and developing a plurality of carbon nanotubes disposed on the metal oxide layer and electrically coupled to the metal substrate.

In an embodiment of the method the step of providing a metal oxide layer may further comprise a step of oxidizing a portion of the metal substrate. The step of providing a metal oxide layer may further comprise heating the metal substrate to a temperature between 250° C. and 1200° C.; and concurrently with the step of heating, exposing the metal substrate to an oxidizing gas. In another embodiment the step of providing a metal oxide layer may include oxidizing the metal substrate by exposing the metal substrate to a solution-based oxidizing agent. In another embodiment the step of providing a metal oxide layer further may comprise heating the metal substrate to a temperature between 20° C. and 1200° C.; and concurrently with the step of heating, exposing the metal substrate to a plasma.

In an embodiment the method may further comprise, in the step of providing carbon nanotubes, synthesizing the carbon nanotubes at least in part by a chemical vapor deposition process. In another step of the embodiment, at least a portion of the carbon that fails to form into the carbon nanotubes is removed, such that the ratio of carbon contained in the nanotubes to the total carbon in the structure is at least 9:10.

In an embodiment, a composite structure is envisioned. The composite structure has a substrate, which itself is made of a first metal and a second metal, the first metal and the second metal being different elements. The substrate has a metal oxide layer with a thickness between 1 nm and 300 nm, where at least 80% of the first metal and 80% of the second metal exist in an oxidized form. The substrate has a metal layer, the first metal and the second metal making up at least 50% of the metal in the metal layer. The thickness of the substrate is less than 500 μm, the ratio of the thickness of the metal layer to the metal oxide layer is greater than 100, and the ratio of the first metal to the second metal is between 1:1 and 10:1. The structure also has a plurality of carbon nanotubes disposed on the substrate, where the metal oxide layer is disposed between the metal layer and the plurality of carbon nanotubes. At least one carbon nanotube is electrically coupled to the metal layer through the metal oxide layer. The first metal and the second metal are selected from a first group consisting of: iron, nickel, aluminum, cobalt, copper, chromium, and gold.

DETAILED DESCRIPTION

Figure 1:
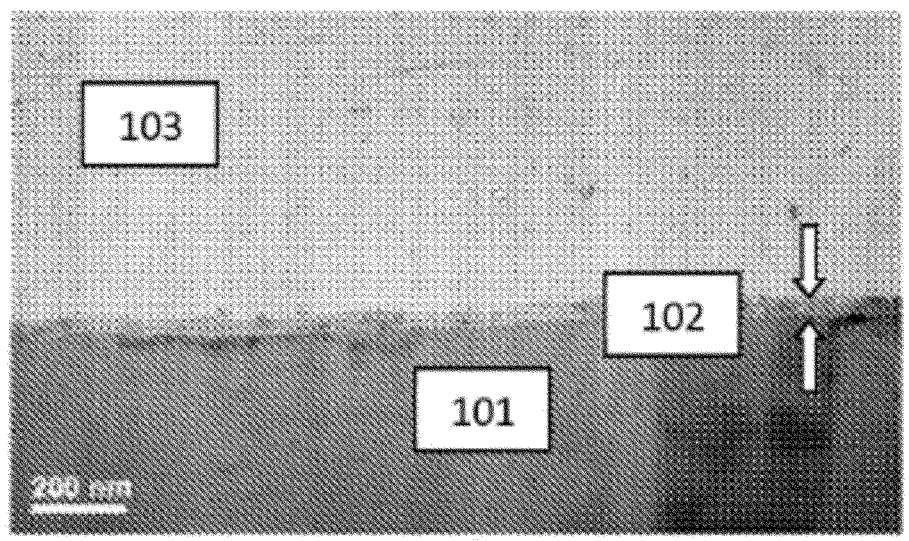
FIG. 1 illustrates carbon nanotubes attached to an oxide layer dispersed on a metal surface at 200 nm resolution as visualized by transmission electron microscopy.

Unless defined otherwise, all technical and scientific terms used herein have the same meaning as is commonly understood by one of ordinary skill in the art to which this invention belongs. In the event that there is a plurality of definitions for a term herein, those in this section prevail unless stated otherwise.

As used herein, "carbon nanotubes" refer to allotropes of carbon with a cylindrical structure. Carbon nanotubes may have defects such as inclusions of $C_5$ and/or $C_7$ ring structures such that the carbon nanotube is not straight and may have periodic coiled structures and/or random defect sites.

As used herein, "ultracapacitors" include electrochemical capacitors, electrical double layer capacitors and supercapacitors.

As used herein, "chemical vapor deposition" refers to plasma enhanced chemical vapor deposition or thermal chemical vapor deposition.

As used herein, "plasma enhanced chemical vapor deposition" refers to the use of plasma (e.g., glow discharge) to transform a hydrocarbon gas mixture into excited species which deposit carbon nanotubes on a metal substrate.

As used herein, "thermal chemical vapor deposition" refers to the thermal decomposition of hydrocarbon vapor in the presence of a catalyst which may be used to deposit carbon nanotubes on a metal substrate.

As used herein, "physical vapor deposition" refers to vacuum deposition methods used to deposit thin films by condensation of a vaporized of desired film material onto film materials and includes techniques such as cathodic arc deposition, electron beam deposition, evaporative deposition, pulsed laser deposition and sputter deposition.

In some aspects, a film stack which includes a metal oxide layer disposed on a metal surface is provided. In some embodiments, the metal surface has a root mean square roughness of less than about 200 nm. In other embodiments, the metal surface includes any metal or any combinations of metals. In other embodiments, the metal surface includes iron, nickel, aluminum, cobalt, copper, chromium, gold or combinations thereof. In still other embodiments, metal substrates are laminated on aluminum substrates.

In some aspects, a film stack which includes a metal oxide layer disposed on a metal substrate is provided. In some embodiments, the metal oxide layer includes any elements and combinations thereof that catalyze the growth of carbon nanotubes. In other embodiments, the metal substrate includes iron, nickel, aluminum, cobalt, copper, chromium, gold and combinations thereof.

In still other embodiments, the metal oxide layer includes oxides of iron, nickel, aluminum, cobalt, copper, chromium, gold or combinations thereof. In still other embodiments, the metal oxide layer includes a catalyst for the growth of carbon nanotubes. In still other embodiments, the metal oxide layer includes particles of iron, nickel, aluminum, cobalt, copper, chromium, gold and combinations thereof.

In some embodiments, the metal oxide layer is less than about 100 nm thick. In other embodiments, the metal oxide layer is between about 100 nm and about 1 nm thick. In still other embodiments, the metal oxide layer is between about 50 nm and about 4 nm thick. In still other embodiments, the metal oxide layer is between about 20 nm and about 4 nm thick. In still other embodiments, the metal oxide layer is between about 75 nm and about 50 nm thick.

In some embodiments, the metal substrate includes any metal or any combinations of metals. In other embodiments, the metal substrate includes iron, nickel, aluminum, cobalt, copper, chromium, gold and combinations thereof. In still other embodiments, the metal substrate comprises alloys of two or more of iron, nickel, cobalt, copper, chromium, aluminum, gold and combinations thereof. In still other embodiments, the alloy is a complete solid solution alloy. In still other embodiments, the alloy is a partial solid solution alloy. In still other embodiments, the alloy is a substitutional alloy. In still other embodiments, the alloy is an interstitial alloy.

In some embodiments, the metal substrate typically has a surface smoothness where the root mean square roughness is less than about 500 nm. In other embodiments, the root mean square roughness of the metal substrate is less than about 200 nm. In still other embodiments, root mean square roughness of the metal substrate is between about 2 nm and about 200 nm. In still other embodiments, root mean square roughness of the metal substrate is between about 5 nm and about 100 nm.

In some embodiments, the metal substrate is less than 500 μm thick. In other embodiments, the metal substrate is between about 500 μm and about 10 μm thick. In still other embodiments, the metal substrate is between about 400 μm and about 10 μm thick. In still other embodiments, the metal substrate is between about 300 μm and about 10 μm thick. In still other embodiments, the metal substrate is between about 200 µm and about 10 µm thick. In still other embodiments, the metal substrate is between about 100 µm and about 10 µm thick. In still other embodiments, the metal substrate is between about 50 µm and about 10 µm thick.

In some embodiments, the metal substrate is between about 500 µm and about 1 µm thick. In other embodiments, the metal substrate is between about 400 µm and about 1 µm thick. In still other embodiments, the metal substrate is between about 300 µm and about 1 µm thick. In still other embodiments, the metal substrate is between about 200 µm and about 1 µm thick. In still other embodiments, the metal substrate is between about 100 µm and about 1 µm thick. In still other embodiments, the metal substrate is between about 50 µm and about 1 µm thick.

In some embodiments, the metal substrate has a thickness of less than about than 500 µm and a root mean square roughness of less than about 200 nm. In other embodiments, the metal substrate has a thickness between about 500 µm and about 10 µm thick and a root mean square roughness between about 2 nm and about 200 nm.

It should be ascertainable that the ranges of the metal oxide disclosed previously may co-exist with any of the ranges of the thickness of the metal substrate. Accordingly the ratios of the metal substrate to the metal oxide layers may be based on any combinations of the metal substrate and the metal oxides.

In some embodiments, the metal substrate may be coated with a material that prevents attachment of the metal oxide layer on the metal substrate (i.e., a protective coating). In other embodiments, the protective coating may partially cover either side of the metal substrate. In still other embodiments, the protective coating completely covers one side of the metal substrate and partially covers the other side of the metal substrate. In still other embodiments, the protective coating partially covers one side of the metal substrate. In still other embodiments, the protective coating completely covers one side of the metal substrate. In still other embodiments, neither side of the metal substrate is covered by a protective coating. In still other embodiments, the protecting coating provide an area without carbon nanotube for electrical tabs for device integration.

Generally, the metal substrate can have any convenient or useful width, length or geometric shape. In some embodiments, the metal substrate has a width greater than 1 mm. Generally, the width of the metal substrate may be any convenient width useful in a continuous roll-to-roll manufacturing process. In some embodiments, the metal substrate has a length greater than 1 mm. In other embodiments, the metal substrate has a length greater than 1 m. In still other embodiments, the metal substrate has a length greater than 10 m. In still other embodiments, the metal substrate has a length greater than 100 m. In still other embodiments, the metal substrate has a length greater than 1000 m.

In some embodiments, the metal substrate is less than about 500 µm thick and has a root mean square roughness of less than about 200 nm and the metal oxide layer is less than about 100 nm thick. In other embodiments, the metal substrate is between about 500 µm thick and about 1 nm thick and has a root mean square roughness of less than about 200 nm and the metal oxide layer is between about 100 nm thick and 1 nm thick. In still other embodiments, the metal substrate is between about 300 µm thick and about 1 nm thick and has a root mean square roughness of less than about 100 nm and the metal oxide layer is between about 75 nm thick and 1 nm thick. In still other embodiments, the metal substrate is between about 200 µm thick and about 1 nm thick and has a root mean square roughness of less than about 50 nm and the metal oxide layer is between about 50 nm thick and 1 nm thick. In still other embodiments, the metal substrate is between about 100 µm thick and about 1 nm thick and has a root mean square roughness of less than about 50 nm and the metal oxide layer is between about 50 nm thick and 1 nm thick.

In some embodiments, chemical vapor deposition is used to attach carbon nanotubes to a metal oxide layer disposed on a metal substrate in a continuous roll-to-roll manufacturing process. The only requirement for the above is that the length of the metal substrate is sufficient for use in a roll-to roll manufacturing process. Generally, the width and length of the metal substrate may be any convenient dimension for use in a continuous roll-to-roll manufacturing process. In some embodiments, the length of the metal substrate is greater than 1 meter. In other embodiments, the length of the metal substrate is greater than 10 meters. In still other embodiments, the length of the metal substrate is greater than 100 meters. In still other embodiments, the metal substrate has a length greater than 1000 meters.

In some embodiments, chemical vapor deposition is used to attach carbon nanotubes to a metal oxide layer disposed on a metal substrate in a batch manufacturing process, where one or more film stack substrates are processed simultaneously. The metal substrate may be precut into any geometric form such as a circle, square, rectangle, triangle, pentagon hexagon, etc. or any other form that may be useful.

In some embodiments, chemical vapor deposition is used to attach carbon nanotubes to a metal oxide layer disposed on a metal substrate in a continuous in-line manufacturing process, where one or more metal substrate substrates are processed sequentially through a processing system with substrates moving linearly or radially through one or more linked processing environments. The metal substrate may be precut into any geometric form such as a circle, square, rectangle, triangle, pentagon hexagon, etc. or any other form that may be useful.

In some embodiments, chemical vapor deposition is used to attach carbon nanotubes to a film stack including a metal oxide layer disposed on a metal substrate in a cluster-tool manufacturing process, where a substrate carrier comprising one or more metal substrate substrates is processed sequentially in one or more linked processing systems in which a discrete processing step is carried out sequentially on the substrate carrier. The metal substrate may be precut into any geometric form such as a circle, square, rectangle, triangle, pentagon hexagon, etc. or any other form that may be useful.

Figure 2:
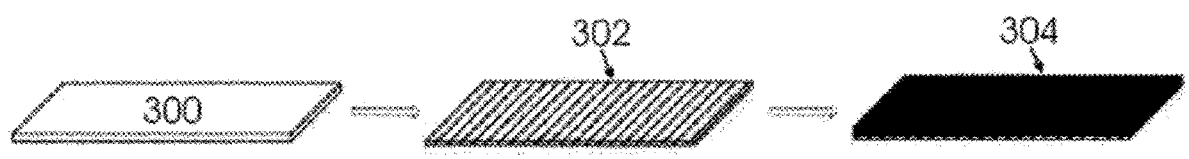
FIG. 2 illustrates processing of a metal surface to an electrode including carbon nanotubes attached to the layer if metal oxide disposed on the metal surface.

Referring now to FIG. 1, an electrode including carbon nanotubes 103 attached to metal oxide layer 102 disposed on metal substrate 101 is illustrated at 200 nm and resolution. Referring now to FIG. 2, processing of a metal surface to an electrode including carbon nanotubes attached to a metal oxide layer disposed on a metal substrate is illustrated. Metal surface 300 (left portion of FIG. 2) is processed to metal oxide layer disposed on a metal surface 302 (right portion of FIG. 2) by a variety of processes, supra. Then, carbon nanotubes are attached to metal oxide disposed on metal surface 302 (right portion of FIG. 2) to provide an electrode including carbon nanotubes attached to a metal oxide layer disposed on a metal substrate 304.

Typical deposition of carbon nanotubes on a Si substrates required two sequential steps, that of an oxide layer (such as $SiO_2$ or $Al_2O_3$) and then a metal catalyst layer on top of the oxide layer. The oxide layer prevents the diffusion of the metal catalyst layer into the Si substrate and improves adhesion of the carbon nanotubes to the Si substrates. The electrical contact between the carbon nanotubes and the Si substrate is poor in this case, and the resulting devices have poor performance.

A number of methods exist for making a film stack which includes a metal oxide layer disposed on a metal surface (center portion of FIG. 2). In some embodiments, the metal oxide layer can be deposited on the metal surface by conventional techniques, well known to those of skill in the art, such as physical vapor deposition and chemical vapor deposition.

In some embodiments, the metal surface may be oxidized by a variety of methods to provide a film stack which includes a metal oxide layer disposed on a metal surface (center portion of FIG. 2). In some embodiments, the metal surface is oxidized with an oxidizing gas at an elevated temperature. In other embodiments, the oxidizing gas is water, oxygen, a nitrogen oxide, chlorine, or fluorine. In still other embodiments, the elevated temperature is between about 300° C. and about 1100° C.

In some embodiments, the metal surface is chemically oxidized. In some embodiments, the metal surface is oxidized with an aqueous solution comprising an oxidizing agent. In other embodiments, the oxidizing agent is a peroxide, hydroperoxide, superoxide, permanganate, chlorate or perchlorate.

In some embodiments, the metal surface is oxidized with plasma. In other embodiments, the plasma is formed from water, oxygen, a nitrogen oxide, chlorine or fluorine at an elevated temperature. In still other embodiments, the elevated temperature is between about 25° C. and about 1100° C.

Figure 3:
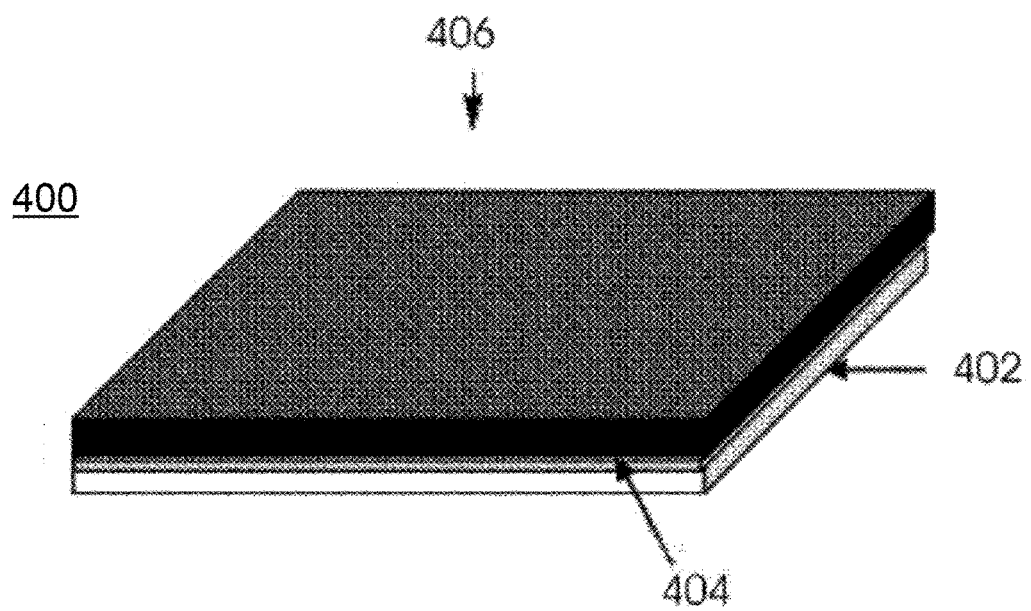
FIG. 3 illustrates one sided carbon nanotube deposition where carbon nanotubes are attached to a layer of metal oxide disposed on one side of a metal surface.
Figure 4:
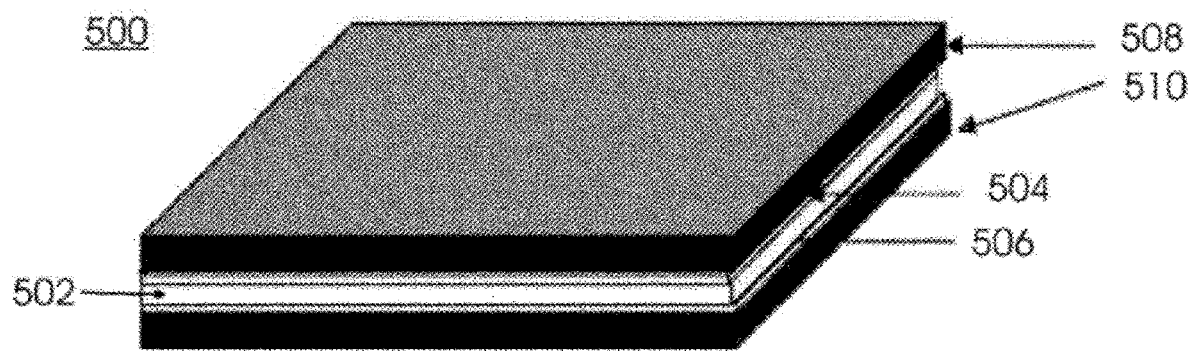
FIG. 4 illustrates two sided carbon nanotube deposition where carbon nanotubes are attached to layers of metal oxide disposed on two sides of a metal surface.

Referring now to FIG. 3, carbon nanotubes 406 are attached to metal oxide layer 404 disposed on metal surface 402 to provide a 1 sided one-sided carbon nanotube deposition 400. Referring now to FIG. 4, carbon nanotubes 508 and 510 are attached to metal oxide layers 504 and 506 disposed on metal surface 502 to provide a 2 sided two-sided carbon nanotube deposition 500.

Figure 5A:
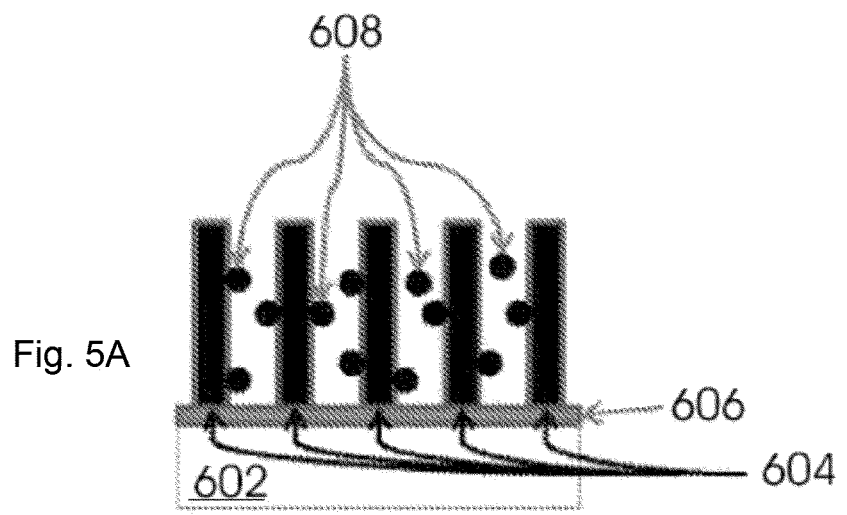
FIG. 5A illustrates the removal of amorphous carbon.
Figure 5B:
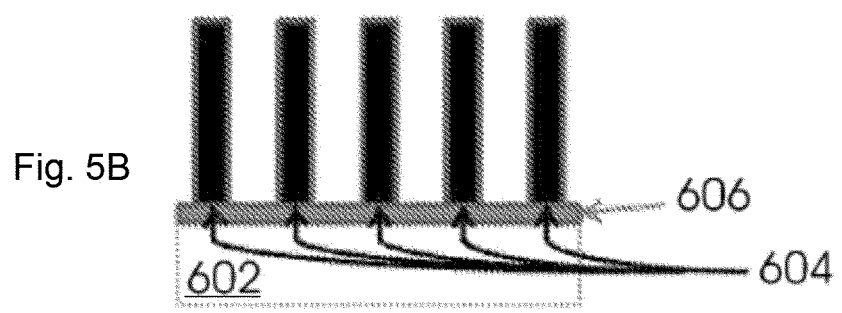
FIG. 5B illustrates an electrode.

Referring now to FIG. 5B, carbon nanotubes 604 are attached to metal oxide layer 606 disposed on metal surface 604 to form an electrode. The carbon nanotubes are highly porous, have a large surface area and high percentage of usable nanopores (i.e., mesopores between about 2 nm to about 50 nm in diameter). Carbon nanotubes are chemically inert and electrically conductive. Carbon nanotubes may be single walled or multi-walled or combinations thereof. Carbon nanotubes useful in the electrodes described herein include other forms such as toruses, nanobuds and graphenated carbon nanotubes. In some embodiments, the carbon nanotubes are vertically aligned. In other embodiments, the carbon nanotubes are in a vertical tower structure (e.g., perpendicular to the metal substrate). Other carbon nanotube configurations include, for example, horizontal or random alignment. In some embodiments, the carbon nanotubes are a random network with a minimal degree of alignment in the vertical direction.

In one embodiment a proportion of the carbon nanotubes are in a relationship to the growth surface of the metal substrate, the relationship being characterized as "orthogonal". In the spatial relationship between the carbon nanotubes and the surface of the metal oxide that the carbon nanotubes are disposed, each carbon nanotube can be thought of as having an "orientation" relative to the surface. Considering a single nanotube, the tube has a "beginning" edge and an "ending" edge. The tube, between the beginning edge and the ending edge has an instantaneous longitudinal axis for every portion of the tube. The average orientation of any carbon nanotube can be thought of as the average of all orientations of the longitudinal axis of that carbon nanotube along its length. A reference plane for the orientation can be formed by the normal to the surface of the metal oxide on which the carbon nanotubes is disposed and any line at a right angle to that normal. A single carbon nanotube is defined, for the purposes of this application, to be "orthogonal" to the surface when the average orientation of the carbon nanotube is less than 30 degrees from the normal in such a reference plane, or when the average orientation of the carbon nanotube is less than 45 degrees in that reference plane and the orientation of either a leading edge or a beginning edge of the carbon nanotube that is not disposed on the surface is also less than 45 degrees from the normal in that plane. Any other orientation of a carbon nanotube is thus defined as being "non-orthogonal".

In some embodiments, carbon nanotubes 604 are attached to metal oxide layer 606 by chemical vapor deposition processes. In other embodiments, carbon nanotubes are attached to a metal oxide layer disposed on a metal substrate by thermal chemical vapor deposition. In still other embodiments, carbon nanotubes are attached to metal oxide layer disposed on a metal substrate by plasma chemical vapor deposition.

Thermal chemical vapor deposition of carbon nanotubes is usually performed with hydrocarbon sources (e.g., methane, ethylene, acetylene, camphor, naphthalene, ferrocene, benzene, xylene, ethanol, methanol, cyclohexane, fullerene, etc.), carbon monoxide, or carbon dioxide at temperatures between about 600° C. and 1200° C. preferably, in the absence of oxygen or reduced amounts of oxygen.

Plasma enhanced chemical vapor deposition of carbon nanotubes is also usually performed with hydrocarbon sources, supra. Here, electrical energy rather than thermal energy is used to activate the hydrocarbon to form carbon nanotubes on metal substrates at preferred temperatures between about 300° C. and greater than 600° C. In some embodiments, carbon nanotubes are grown directly on the metal oxide layer without deposition of either metal catalyst or use of binders.

In some embodiments, a portion of the metal oxide layer disposed on a metal surface is pretreated to prevent attachment of carbon nanotubes to that portion of the layer. In other embodiments, a portion of the metal oxide layer disposed on a metal surface is pretreated with a film such as a metal film or an organic (polymer) film that prevents the direct growth of carbon nanotubes in these areas. Films such as those described above can be deposited, for example, by metal evaporation methods (such as thermal ore-beam evaporation) or by ink jet printing to give a desired pattern. Protective films may also be patterned by using a hard mask and/or photolithography techniques.

In some embodiments, plasma treatment (e.g., $F_2$, $NH_3$) of carbon nanotube surfaces is used to increase surface wettability by increasing the hydrophilicity of the surface. Such treatment enables ions from electrolytes to access the pores of the carbon nanotubes which increases charge density.

Referring to FIG. 5A, during attachment of carbon nanotubes 604 to metal oxide layer 606 disposed on metal surface 602, a side product is amorphous carbon 608. Amorphous carbon reduces the porosity of carbon nanotubes, thus decreasing electrode performance. In some embodiments, selection of hydrocarbon precursors and control of temperature reduces the amount of amorphous carbon formed. Amorphous carbon may be removed by a number of methods including, for example, thermal or plasma cleaning with $O_2$ and exposure to strong acid, halogens and strong oxidants (e.g., $H_2O_2$). In some embodiments, vapor which includes water or $H_2O_2$ or combinations thereof may be used to remove amorphous carbon as described by Deziel et al. U.S. Pat. No. 6,972,056.

In some embodiments, a continuous water treatment process is used to remove impurities such as amorphous carbon from carbon nanotubes. The process includes a wet inert carrier gas stream (e.g., argon or nitrogen) and may include an additional dry carrier gas stream which is added to adjust water concentration. Water is added using any water infusion method (e.g., bubbler, membrane transfer system, etc.). In some embodiments, water vapor is introduced into a process chamber maintained at between 600° C. and 1200° C. to remove amorphous carbon and other impurities associated with carbon nanotubes attached to a metal oxide layer disposed on a metal substrate.

In some embodiments, amorphous carbon is removed in a discrete step after deposition of carbon nanotubes on a metal oxide layer disposed on a metal substrate. In other embodiments, amorphous carbon is removed simultaneously during chemical vapor deposition. In still other embodiments, amorphous carbon is removed simultaneously during chemical vapor deposition and also in a discrete second step.

In an embodiment at least one carbon nanotube disposed on the surface is electrically coupled to the metal layer through the metal oxide layer. In one embodiment the contact is ohmic in nature. For purposes of this disclosure, "ohmic" means a relationship that substantially satisfies Ohm's Law of V=IR, or voltage drop is the product of the current and the resistance of the metal oxide layer. For purposes of this disclosure "ohmic" shall mean a relationship in which Ohm's Law is satisfied +/−10%. In an embodiment, and for certain metal oxide layers, the current that passes from the carbon nanotubes to the metal layer may be other than ohmic, which could include such non-ohmic currents as, without limitation, p-n junction currents, tunnel junction currents, Schottky barrier currents, tunnel junction currents, rectifying heterojunction currents, breakdown junction currents, to name a few.

Figure 6:
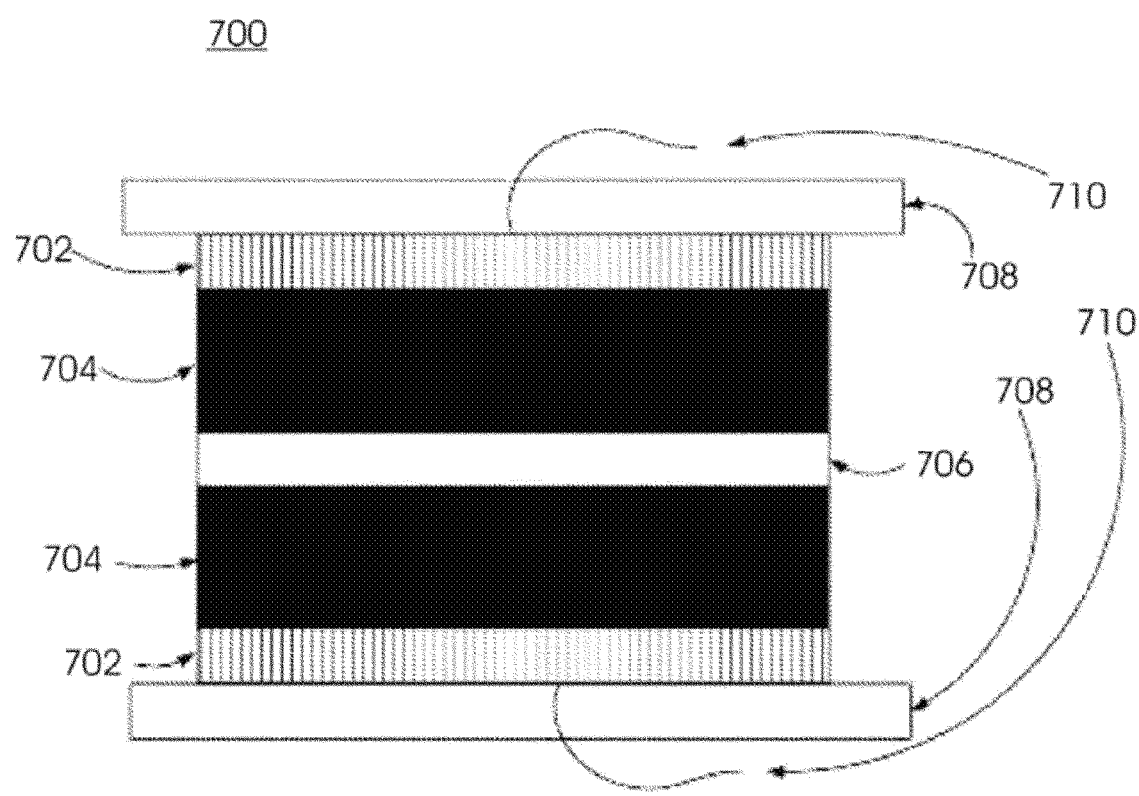
FIG. 6 is a block diagram of an exemplary ultracapacitor of the invention.

FIG. 6 is a block diagram of an exemplary ultracapacitor 700, which may be an electrochemical double layer capacitor with an operating voltage of greater than 0.05 V. Ultracapacitor 700 has two carbon nanotube electrodes 704 separated by an electrolytic membrane 706. In some embodiments, carbon nanotube electrodes 704 may be manufactured in any continuous manufacturing process including roll to roll fashion. In some embodiments, carbon nanotube electrodes 704 may be made with or without removal of amorphous carbon and attached to metal substrate which may include catalysts or binders or may not.

Electrical leads 710 (e.g., thin metal wires) contact collectors 702 (e.g., metal substrates 702) to make electrical contact. Ultracapacitor 700 is submerged in an electrolyte solution and leads 710 are fed out of the solution to facilitate capacitor operation. Clamp assembly 708 (e.g., coin cells or laminated cells) holds carbon nanotubes 704 attached to metal substrate 702 in close proximity while membrane 706 maintain electrode separation (i.e., electrical isolation) and minimizes the volume of ultracapacitor 700.

In some embodiments, ultracapacitor 700 consists of two vertically aligned multi-walled carbon electrode tower electrodes 704 attached to metal substrate 702 and an electrolytic membrane 706 (e.g., Celgard or polypropylene) which are immersed in a conventional aqueous electrolyte (e.g., 45% sulfuric acid or KOH). In other embodiments, ultracapacitor 700 consists of two vertically aligned single-walled carbon electrode tower electrodes 704 attached to metal substrate 702 and an electrolytic membrane 706 (e.g., Celgard or polypropylene) which are immersed in a conventional aqueous electrolyte (e.g., 45% sulfuric acid or KOH).

In some embodiments, the ultracapacitor is a pseudocapacitor. In some of these embodiments, carbon nanotubes are loaded with oxide particles (e.g., $RuO_2$, $MnO_2$, $Fe_3O_4$, $NiO_2$, $MgO_2$, etc.). In other of these embodiments, carbon nanotubes are coated with electrically conducting polymers (e.g., polypyrrole, polyaniline, polythiophene, etc.). In some embodiments, the ultracapacitor is an asymmetric capacitor (i.e., one electrode is different from the other electrode in the capacitor).

In some embodiments, the ultracapacitors described herein can be stacked to form multiple pairs of electrodes. In other embodiments, the ultracapacitors described herein may be used to form stacked sheets of electrodes.

Figure 7:
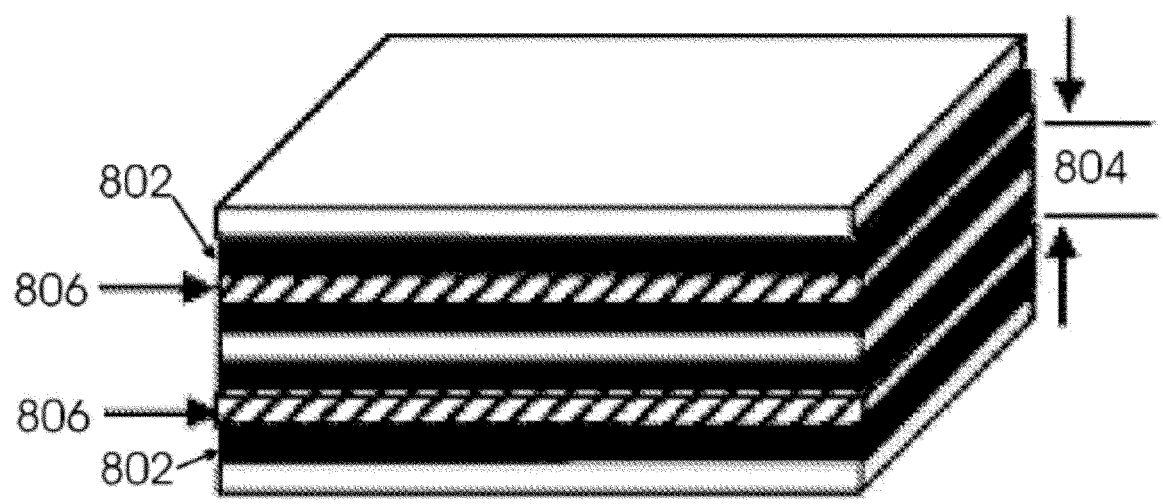
FIG. 7 illustrates an example of a device composed of two-sided CNT electrode.

Referring now to FIG. 7, an exemplary three electrode layer device is illustrated. The device has two one-sided electrodes 802 on the top and bottom with a two-sided electrode 804 sandwiched in the middle. Two separators 806 are in between the electrodes.

Figure 8A:
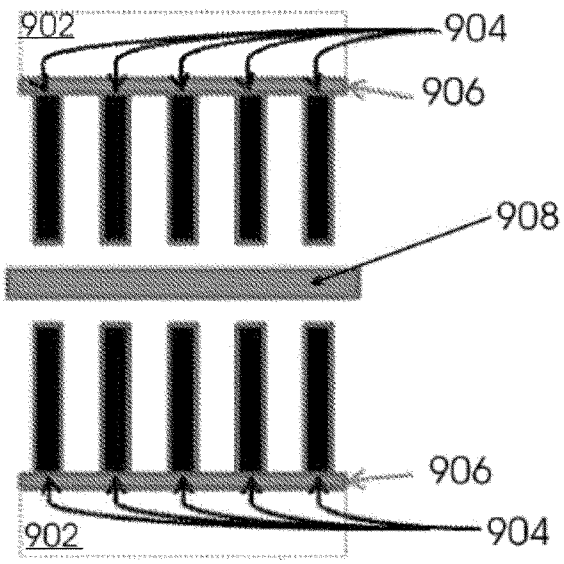
FIGS. 8A and B illustrate coupling of carbon nanotubes attached to a metal oxide layer disposed on a metal surface to a membrane and submersion of the carbon nanotubes in an electrolyte solution.

Referring now to FIG. 8A, electrodes, which include carbon nanotubes 904 attached to metal oxide layers 906 disposed on metal surface 902 prepared as described, supra, and a membrane 908 is selected. Membrane 908 is a porous separator such as, for example, polypropylene, NAFION®, CELGARD®, CELGARD 3400, glass fibers or cellulose. The electrodes, which include carbon nanotubes 904 attached to metal oxide layers 906 disposed on metal surface 902 are coupled to membrane 908 by a clamp assembly.

Figure 8B:
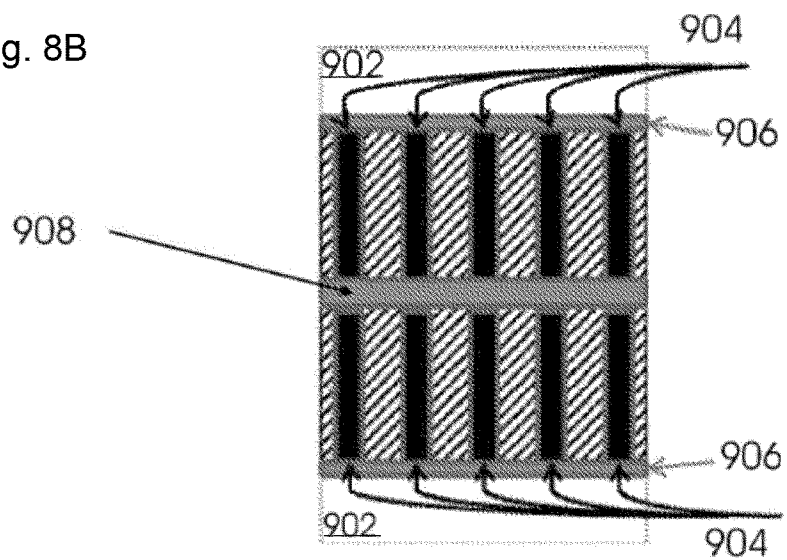

Referring now to FIG. 8B, carbon nanotubes 904 attached to metal oxide layer 906 disposed on metal surface 902 and coupled to membrane 908 are immersed in electrolyte (shaded portion of Figure) which may be a liquid or gel. In some embodiments, carbon nanotubes 904 may be suffused with a gas or combinations thereof including air. Alternatively, in some embodiments, the space around carbon nanotubes 904 may be evacuated by a vacuum source. In some embodiments, electrolytes include, for example, aqueous electrolytes (e.g., sodium sulfate, magnesium sulfate, potassium chloride, sulfuric acid, magnesium chloride, etc.), organic solvents (e.g., 1-ethyl-3-methylimidazolium bis (pentafluoroethylsulfonyl)imide, etc.), electrolyte salts soluble in organic solvents, tetralkylammonium salts (e.g., $(C_2H_5)_4NBF_4$, $(C_2H_5)_3CH_3NBF_4$, $(C_4H_9)_4NBF_4$, $(C_2H_5)_4NPF_6$, etc.), tetralkylphosphonium salts (e.g. $(C_2H_5)_4PBF_4$, $(C_3H_7)_4PBF_4$, $(C_4H_9{}_{14}PBF_4$, etc.), lithium salts (e.g., $LiBF_4$, $LiPF_6$, $LiCF_3SO_3$, etc., N-alkyl-pyridinium salts, 1,3 bisalkyl imidazolium salts, etc.), etc.

The carbon nanotubes described herein may be used in a wide variety of devices. Carbon nanotubes may be used as electrodes for ultracapacitors, or lithium ion batteries. In addition carbon nanotubes may be used in methane and hydrogen storage, solar cells, electrocatalysts, and catalysts supports for fuel cells, and porous carbon for lithium sulfur and lithium oxygen batteries.

Ultracapacitors which include carbon nanotubes described herein may be used in a wide variety of applications, such as for example, electric transportation technology, (e.g., electric vehicles, electric hybrid vehicles, micro hybrids, catalytic converter preheater, etc.), electric utility industry (e.g., emergency backup power system, grid system stability improvement system, charging devices, smart grids, etc.) consumer electronics, (e.g., cellular telephones, cameras, computers, pagers, copy machines, amplifiers, etc.)

batteries (e.g., lithium, magnesium, aluminum, lead, mercury, iron, cadmium, nickel batteries, etc.) medical electronics (e.g., defibrillators, drug delivery units, neurological stimulators, etc.), military devices (e.g., missiles, aerial vehicles, communication devices, etc.) etc.

Embodiments of the present disclosure thus offer advantages over the prior art and are well adapted to carry out one or more of the objects of the disclosure. However, each of the appended claims do not require each of the components and acts described above and is in no way limited to the above-described embodiments and methods of assembly and operation. Any one or more of the above components, features and processes may be employed in any suitable configuration without inclusion of other such components, features and processes. Moreover, the present disclosure includes additional features, capabilities, functions, methods, uses and applications that have not been specifically addressed herein but are, or will become, apparent from the description herein, the appended drawings and claims.

The methods described above and which may be claimed herein and any other methods which may fall within the scope of the appended claims can be performed in any desired suitable order and are not necessarily limited to the sequence described herein or as may be listed in any appended claims. Further, the methods of the present disclosure do not necessarily require use of the particular embodiments shown and described in the present application, but are equally applicable with any other suitable structure, form and configuration of components.

While embodiments have been shown and described, many variations, modifications and/or changes of the system, apparatus and methods herein, such as in the components, details of construction and operation, arrangement of parts and/or methods of use, are possible, contemplated by the patent applicant(s), within the scope of the appended claims, and may be made and used by one of ordinary skill in the art without departing from the spirit or teachings of this disclosure and scope of appended claims. Thus, all matter herein set forth or shown in the accompanying drawings should be interpreted as illustrative, and the scope of this disclosure and the appended claims should not be limited to the embodiments described and shown herein.

What is claimed is:

1. An ultracapacitor comprising:
a composite structure comprising:
a substrate comprising:
a first metal and a second metal, the first metal and the second metal being different elements, the substrate comprising:
a metal oxide layer between 1 nm and 300 nm wherein at least 80% of the first metal and 80% of the second metal exist in an oxidized form;
a metal layer, wherein the first metal and the second metal make up at least 50% of the metal in the metal layer; and
wherein the thickness of the substrate is less than 500 µm, the ratio of the thickness of the metal layer to the metal oxide layer is greater than 100, and the ratio of the first metal to the second metal is between 1:1 and 10:1;
a plurality of carbon nanotubes disposed on the substrate, wherein the metal oxide layer is disposed between the metal layer and the plurality of carbon nanotubes, wherein the plurality of carbon nanotubes comprise a high percentage of mesopores between about 2 nm to about 50 nm in diameter;
wherein at least one carbon nanotube is electrically coupled to metal layer through the metal oxide layer;
wherein the first metal is selected from a first group consisting of: iron, nickel, aluminum, cobalt, copper, chromium, and gold; and
wherein the second metal is selected from the first group.

2. The ultracapacitor of claim 1 comprising:
a metal substrate having a thickness less than 500 µm, the metal substrate further comprising:
the metal oxide layer disposed over at least a majority of a first surface of the metal substrate, the average thickness of the metal oxide layer being less than 150 nm; and
the metal oxide layer being comprised of at least the first metal and the second metal, wherein the first metal and the second metal are different elements; and
the plurality of carbon nanotubes disposed on a first surface of the metal oxide layer.

3. The ultracapacitor of claim 2, wherein the first surface of the metal substrate has root mean square roughness of 100 nm or less.

4. The ultracapacitor of claim 1, wherein at least a first carbon nanotube is electrically coupled to the substrate.

5. The ultracapacitor of claim 4, wherein an electrical junction between the first carbon nanotube and the substrate is ohmic.

6. The ultracapacitor of claim 4, wherein an electric junction between the first carbon nanotube and the substrate is non-ohmic.

7. The ultracapacitor of claim 4, wherein the metal oxide layer has a resistivity of less than $1 \times 10^{14}$ Ω-m.

8. The ultracapacitor of claim 1, wherein the metal oxide layer comprises:
a first metal oxide comprising the first metal;
a second metal oxide comprising the second metal; and
wherein the first metal is selected from a first group of metals, the first group of metals consisting of: iron, nickel, aluminum, cobalt, copper, chromium, and gold.

9. The ultracapacitor of claim 1, wherein the ratio of the first metal to the second metal in the oxide layer is at least 6:5.

10. The ultracapacitor of claim 1, wherein the first metal is selected from a first group, the second metal is selected from the first group and the first group consists of: iron, nickel, aluminum, cobalt, copper, chromium, and gold.

11. The ultracapacitor of claim 2, wherein the carbon nanotubes are disposed on the metal oxide wherein at least 50% of the carbon nanotubes are orthogonal to the first surface of the metal oxide.

12. The ultracapacitor of claim 2, wherein the carbon nanotubes are disposed on the metal oxide wherein at least 50% of the carbon nanotubes are non-orthogonal to the first surface of the metal oxide.

13. The ultracapacitor of claim 1, wherein the ratio of carbon in the carbon nanotubes to the total amount of carbon in the total structure from process steps in the formation of the structure is at least 9:10.

* * * * *